United States Patent [19]
Sugiura

[11] Patent Number: 4,766,652
[45] Date of Patent: Aug. 30, 1988

[54] BOARD FASTENER

[75] Inventor: Haruyuki Sugiura, Kariya, Japan

[73] Assignee: Kitagawa Industries Co., Ltd., Nagoya, Japan

[21] Appl. No.: 916,110

[22] Filed: Oct. 7, 1986

[30] Foreign Application Priority Data

Apr. 2, 1986 [JP] Japan .................................. 61-76165

[51] Int. Cl.$^4$ ............................ F16B 2/00; F16B 5/06
[52] U.S. Cl. ....................................... 24/453; 428/99; 24/297; 174/138 D; 411/508
[58] Field of Search .......................... 428/119, 99, 100; 24/297, 453, 326, 573; 174/138 D; 411/508

[56] References Cited

FOREIGN PATENT DOCUMENTS 51-39095 9/1976 Japan .............................. 174/138 D
1541448 2/1979 United Kingdom .......... 174/138 D Primary Examiner—Alexander S. Thomas
Attorney, Agent, or Firm—Oblon, Fisher, Spivak, McClelland & Maier

[57] ABSTRACT

A board fastener is provided to detachably secure and support one or more boards such as printed circuit boards in position spaced apart from a chassis or from each other. Furthermore, the board fastener can securely support a second board to prevent the same from slipping out of the fastener. The board fastener includes a spring bar and a thrust-up member for pushing the mounted second board up, thus allowing the second board to be easily removed from the fastener.

4 Claims, 6 Drawing Sheets

BOARD FASTENER

FIELD OF THE INVENTION

This invention relates to a board fastener for detachably securing and supporting one or more boards such as printed circuit boards in position spaced apart from a chassis or from each other.

BACKGROUND OF THE INVENTION

Generally, in electronic or electrical apparatuses or devices, when a board is mounted on a chassis or when another board is further mounted on the board, rigid posts with screws have been used for holding the board spaced apart from the chassis or for spacing and holding the boards. Thus, there is a problem that attachment of boards is troublesome.

Prior art structures have been provided to solve the above-mentioned problem. For example, a board fastener 1 shown in FIGS. 10 and 11 has been proposed (G.B. Pat. No. 1 541 448). FIG. 10 is a side view of the board fastener, and FIG. 11 is a sectional view thereof, taken on line XI—XI of FIG. 10. In the drawings, a first board securing member 5 (a pair of diverging wings) for securing a first circuit board 4 is provided on the lower surface 3 of a base 2. A rigid upstanding post 8 for spacing the first circuit board 4 and a second circuit board 7 is formed on the upper surface 6 of the base 2. An elongated shaft 9 is formed above the post 8. A resilient arm 10 extends upwardly from a post rib 8a projecting from the upper surface 6 of the base 2. A resilient locking tooth 11 for locking the second circuit board 7 is integrally formed on the arm 10. The arm 10 and the locking tooth 11 are made of synthetic resin.

In securing the second circuit board 7, as shown in FIG. 10, the elongated shaft 9 enters an aperture 12 in the second circuit board 7 while the second circuit board 7 is pressed downwardly. The resilient arm 10 is pushed open by an edge 13 of the second circuit board 7, and a reverse detention member 11a that is part of the locking tooth 11 then engages the edge 13 of the second circuit board 7. Thus, the second circuit board 7 is easily secured by co-operation of the locking tooth 11 and the post 8.

The board fastener 1 described above, however, has a problem that removal of the second circuit board 7 from the board fastener is troublesome, although mounting thereof is easily accomplished. To remove the second circuit board 7, the second circuit board 7 must be pulled up while the edge 13 of the second circuit board 7 is drawn apart from the reverse detention member 11a by force applied on a barb 11b of the locking tooth 11.

OBJECTS OF THE INVENTION

Accordingly, it is an object of this invention to provide an improved board fastener on which a second board is easily mounted and from which the same is easily removed so as to improve operation efficiency.

Another object of this invention is to provide a board fastener for securely supporting a second board to prevent the same from slipping out of the fastener.

SUMMARY OF THE INVENTION

In order to achieve these and other objects, a board fastener 20 according to this invention includes a base 21 for supporting a first board 22 against the lower surface 23 thereof; a first board securing member 24, formed on the lower surface 23 of the base 21, for securing the first board 22; a post 30, formed on the upper surface 26 of the base 21, for spacing the first board 22 and a second board 27; a second board mounting projection 31 extending upwardly from the post 30, for entering an aperture 27b formed near an edge 27a of the second board 27; a handle 42 including a reverse detention member 44, a handling member 46, and a thrust-up member 47, the reverse detention member 44 engaging the second board 27 on its upper surface opposite the surface which the post 30 engages, and gripping the second board 27 in co-operation with the post 30, the handling member 46 drawing apart the reverse detention member 44 from the edge 27a of the second board 27 to remove the mounted second board 27, and the handling member 46 further including a sliding part 45 for sliding the edge 27a of the second board 27 thereon, thus allowing the second board 27 to be held in position and to push open the reverse detention member 44 so as to mount the second board 27, and the thrust-up member 47, formed to be opposed to the reverse detention member 44 on the opposite side of the second board 27, pushing the second board 27 up when the reverse detention member 44 is drawn apart from the edge 27a of the second board 27; and a spring means connected to the base 21 and to the handle 42.

In mounting the second board 27, the second board mounting projection 31 determines the mounting position. While being downwardly pressed, the second board 27 slides on the sliding part 45 and pushes open the reverse detention member 44. When the second board 27 is pressed down to the upper surface of the post 30, the reverse detention member 44 engages the edge 27a of the second board 27. Thus, the second board 27 is secured by co-operation of the reverse detention member 44 and the post 30.

On the other hand, to remove the mounted second board 27, the handling member 46 of the handle 42 is pressed outwardly to draw apart the reverse detention member 44 from the edge 27a of the second board 27. While the spring means is contracted by the downward component of the pressed force and the handle 42 moves toward the base 21, the thrust-up member 47 rotates around the joint 47b thereof so as to thrust the second board 27 up. As a result, the edge of the reverse detention member 44 is positioned at the edge 27a of the second board 27, and the reverse detention member 44 presses the edge 27a of the second board 27 by restoring force of the spring means. Since the reverse detention member 44 is free of the second board 27 at this moment, the second board 27 can then be easily pulled up.

BRIEF DESCRIPTION OF DRAWINGS

The foregoing and other objects and features of the present invention will become more apparent upon a consideration of the following description taken in connection with the accompanying drawings, wherein like numerals denote like elements and in which.

DETAILED DESCRIPTION OF PREFERRED EMBODIMENTS

Figure 1:
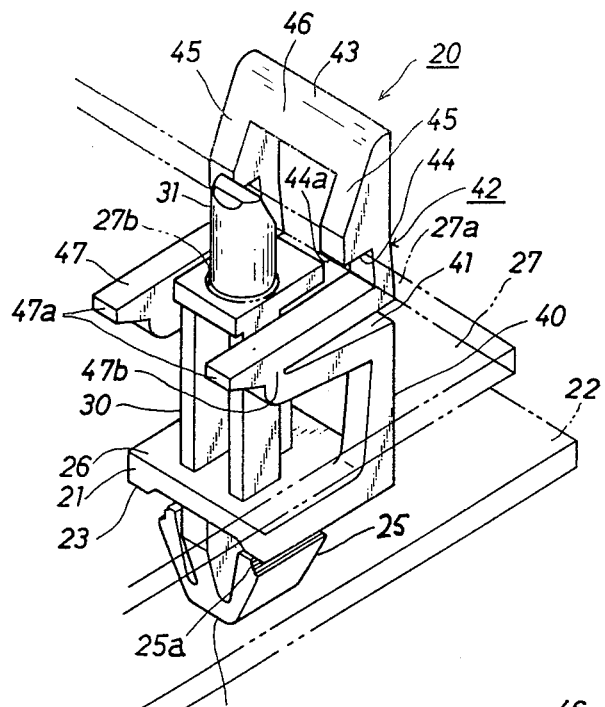
FIG. 1 is a perspective view illustrating a board fastener of a first preferred embodiment according to the invention supporting boards shown in two dots chain lines.
Figure 2:
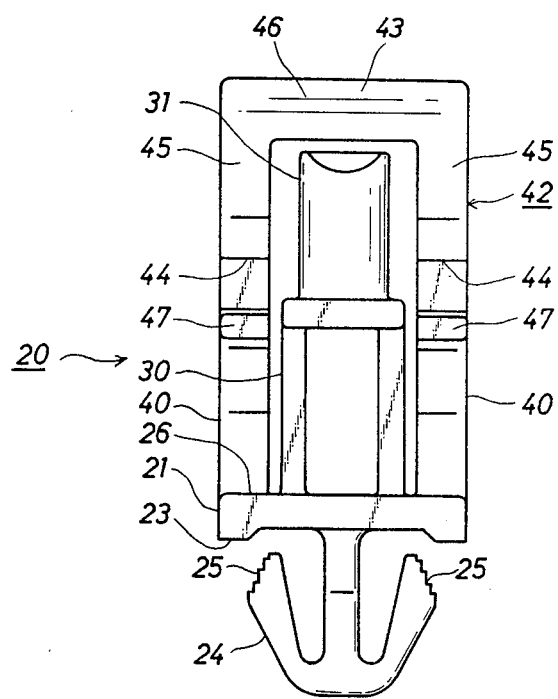
FIG. 2 is a front view of the board fastener shown in FIG. 1, omitting the boards.
Figure 3:
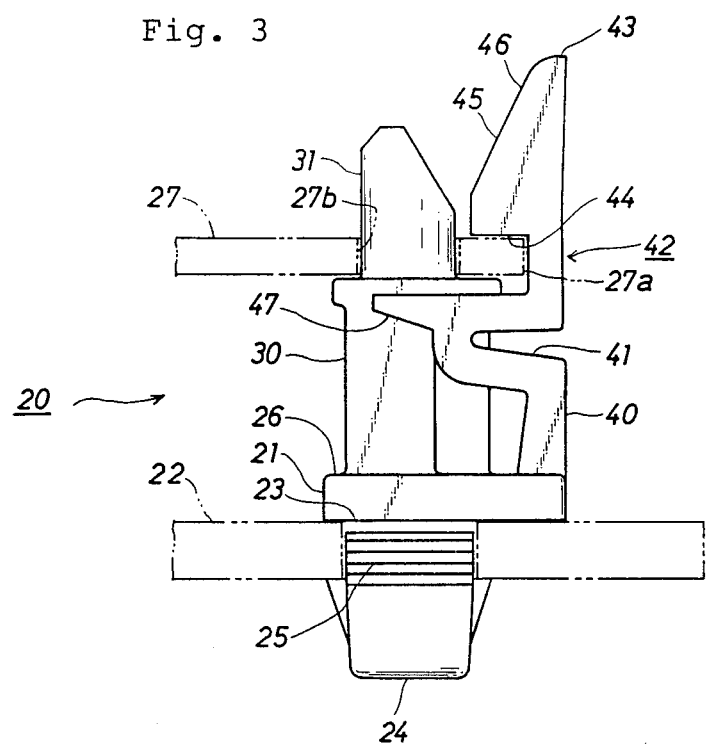
FIG. 3 is a side view of the board fastener taken at right angles to FIG. 2, the boards in section being shown in mounted position.

A first preferred embodiment of this invention will be described with reference to the attached drawings of FIGS. 1 through 4.

In the drawings, a first board securing member 24 for securing a first board 22 is formed on the lower surface 23 of a base 21. The first board securing member 24 has two resilient branches 25. When the first board securing member 24 enters an aperture of the first board 22, the branches 25 are elastically bent inward. One of engaging teeth 25a formed on free ends of the branches 25 engage inside of the aperture by the elastic restoring force of the branches, thus preventing the board fastener from slipping out of the aperture of the first board 22. Rigid upstanding posts 30 formed on the upper surface of the base 21 hold the first board 22 and a second board 27 in parallel and in position spaced apart from each other. A column-shaped second board mounting projection 31 extends upwardly from the posts 30.

Resilient arms 40 are formed on two corners of the same edge of the upper surface 26 of the base 21. A handle 42 is integrally formed on the arms 40 by means of spring bars 41. The handle 42 includes two reverse detention members 44, a handling member 46 and two thrust-up members 47. The reverse detention members 44 engage the upper surface of the second board 27, which is opposed to the surface that the posts 30 engage, so as to lock the second board 27 in mounting position co-operating with the posts 30. The handling member 46 includes a top bar 43 and two sliding parts 45. The sliding parts 45 are inclined between the top bar 43 and the reverse detention members 44. In mounting the second board 27, an edge 27a of the second board 27 slides on the slopes of the sliding parts 45 and pushes open the reverse detention members 44. Thus, the second board 27 is positioned on the posts 30, and the reverse detention members 44 engage the second board 27. The handling member 46 draws apart the reverse detention members 44 from the edge 27a of the second board 27 to remove the second board 27. The thrust-up members 47, formed in position opposite the reverse detention members 44 on the opposite side of the second board 27, thrust the second board 27 up when the reverse detention members 44 are drawn apart from the edge of the second board 27. Each of two spring bars 41 is inclinedly formed between the top portion of each resilient arm 40 and a joint 47b, which is formed near the edge 47a opposite the reverse detention member 44. When the reverse detention members 44 are drawn apart from the edge of the second board 27, the spring bars 41 are downwardly deflected, thus pushing down the reverse detention members 44 in the direction of the first board 22. The board fastener 22 described above is integrally formed and made of resilient synthetic resin.

Operations for mounting and removing the second board 27 on and from the board fastener 20 will be explained.

To mount the second board 27, the second board mounting projection 31 first enters an aperture 27b, which is formed near the edge of the second board 27 and the edge 27a of the board 27 is then pressed down along the sliding parts 45. The reverse detention members 44 are pushed open until the second board 27 reaches the upper surface of the posts 30. Thus, the second board 27 is engaged to be locked between the reverse detention members 44 and the posts 30.

Figure 4:
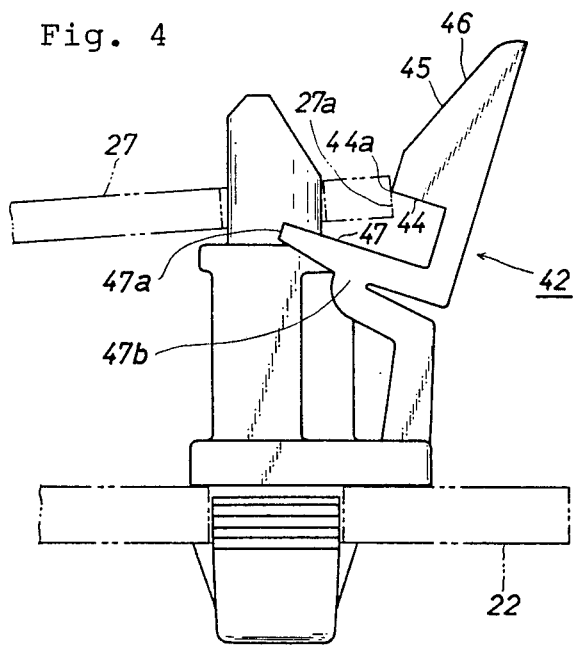
FIG. 4 is a side view of the board fastener from the same angle as FIG. 3, the boards in section during mounting or removal being shown.

To remove the second board 27, the handling member 46 is outwardly pressed so as to draw apart the reverse detention members 44 from the edge 27a of the second board 27. Since each thrust-up member 47 rotates around each joint 47b thereof, as shown in FIG. 4, the edges 47a of the thrust-up members 47 rise, and the second board 27 is thrust up while the handle 42 moves in the direction of the first board 22. If the force applied on the handle 46 is gone, the edge 27a of the second board 27 stays pressed by but disengaged from the edges 44a of the reverse detention members 44, as shown in FIG. 4. The second board 27 can then be easily removed from the board fastener 20.

In the board fastener 20 of the first embodiment, when the second board 27 is removed, there is no need to perform pressing of the handle and pulling up of the second board 27 at the same time. Thus, removal of the second board 27 can be easily accomplished. Especially, when the second board 27 is secured by two or more board fasteners 20, the board fasteners 20 can be disengaged from the second board 27 one by one, and the second board 27 is then pulled up. Thus, the operation efficiency is remarkably improved. On the other hand, the second board 27 can be easily mounted on the board fastener of the first embodiment by one action like the conventional one. There is also another advantage in the board fastener of the first embodiment. When the upthrust shock is applied on the second board 27 secured by the co-operation of the reverse detention members 44 and the posts 30, the spring bars 41 absorb the shock, thus preventing the second board 27 from slipping out of the board fastener.

The spring bar 41 of the first embodiment extends from the top portion of the resilient arm 40 in the direction of the center of the second board 27 to reach the thrust-up member 47. For example, however, the spring bar 41 may extend from the top portion of the resilient arm 40 in the direction of the edge of the second board 27 to reach the extension of the thrust-up member 47 which elongates in the direction of the edge 27a of the second board 27. The spring bar 41 may extend at right angles to the above-mentioned extended direction of the spring bar 41 i.e., in parallel with the edge 27a of the second board 27.

An example using the board fastener 20 of the first embodiment described above will be explained.

Figure 5:
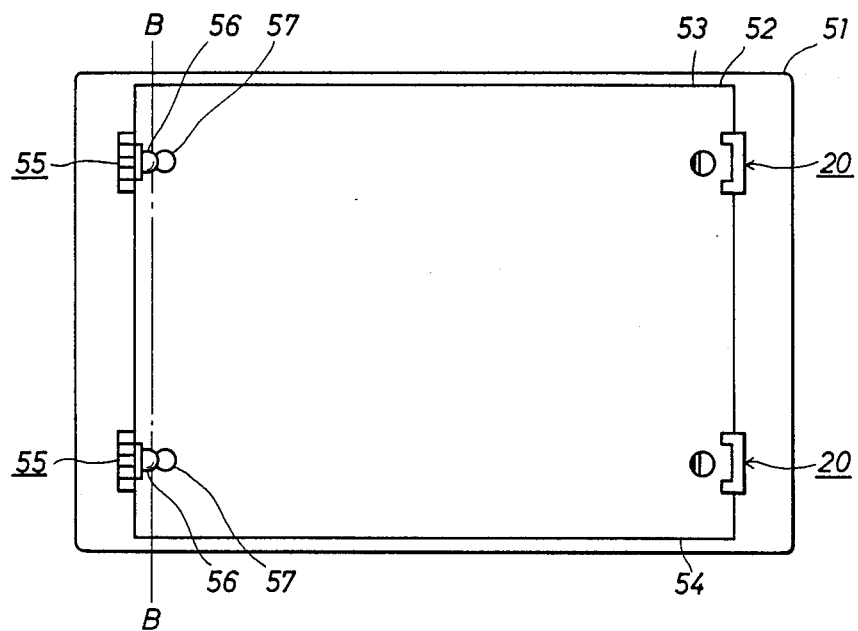
FIG. 5 is a plan view showing an example of use of the board fastener of FIG. 1, in which two boards are supported by the board fasteners of the first embodiment at one side and hinges at the other side.
Figure 6:
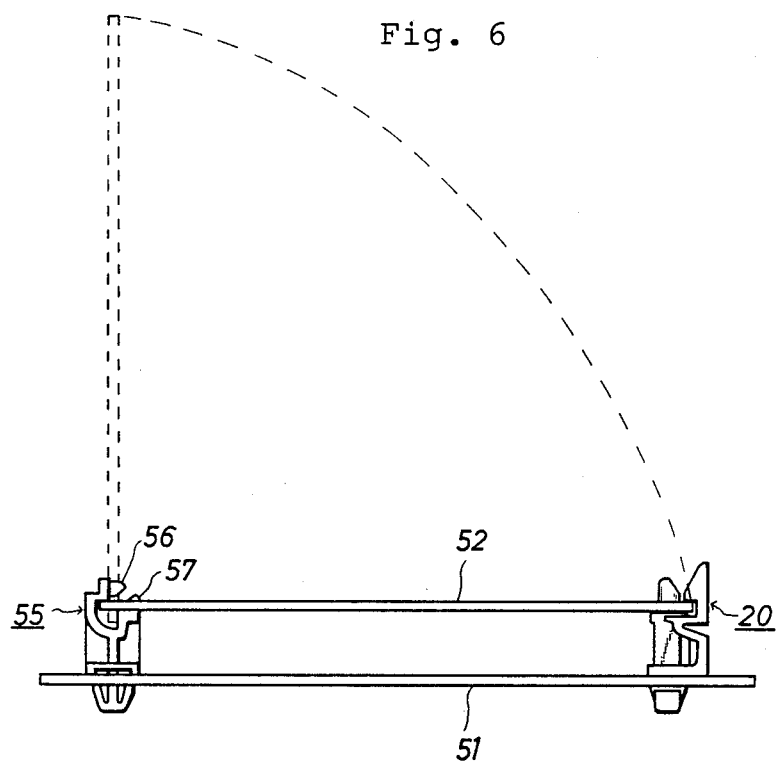
FIG. 6 is a side view of the example of FIG. 5, the boards being shown in mounted position and the rotated second board shown in dotted lines.

FIG. 5 is a plan view showing that two of the board fasteners 20 described above space and hold a first board 51 and a second board 52 co-operating with two hinges 55, and FIG. 6 is a side view of FIG. 5. As shown in the drawings, two corners 53 and 54 of one edge of the first board 51 are respectively locked by the board fasteners 20 and the other two corners of the first board 51 are held by hinges 55. Each hinge 55 has two projections 56 and 57 which are opposed to each other just like edges of an open ring. The projections 56 and 57 enter an aperture of the second board 52. Thus, the second board 52 can be rotated around B-B line of FIG. 5, as shown in dotted lines of FIG. 6.

Figure 7:
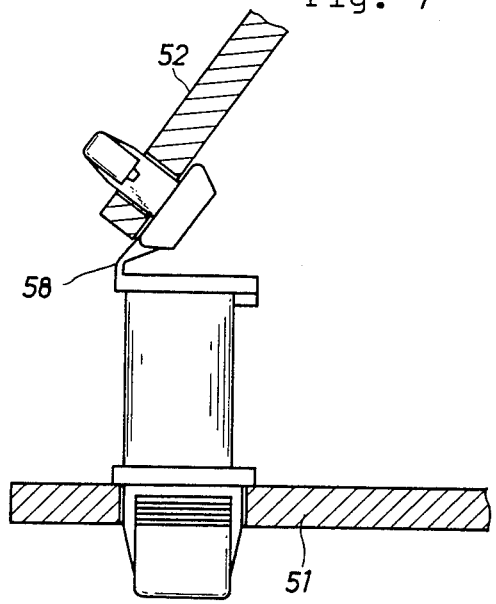
FIG. 7 is a side view of another hinge for boards which can be used in the example of FIG. 5.

In the example described above, when the second board 52 is removed, the board 52 can be temporarily retained in the state shown in FIG. 4 i.e., in the state that the board fasteners 20 disengage but hold the second board 52. Thus, removal of the second board 52 is easily accomplished. The construction of the above-mentioned hinge 55 is not restricted. For example, another hinge 58 shown in FIG. 7 may be used instead of the hinge 55, or four board fasteners 20 may be used instead of using the hinges 55 with two board fasteners 20.

A second preferred embodiment according to the invention will be described with reference to FIGS. 8 and 9.

Figure 8:
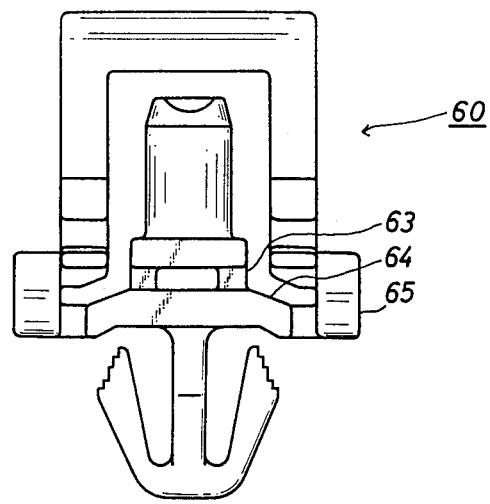
FIG. 8 is a front view of a board fastener of a second preferred embodiment according to the invention, omitting boards.
Figure 9:
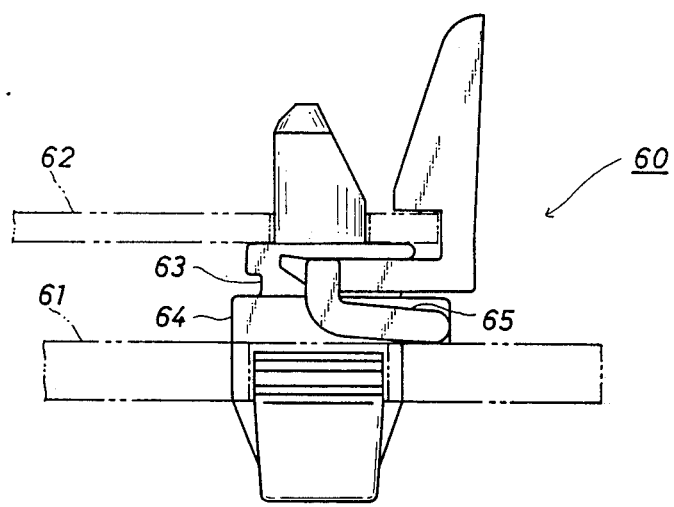
FIG. 9 is a side view of the board fastener taken at right angles to FIG. 8, boards in section being shown in mounted position.
Figure 10:
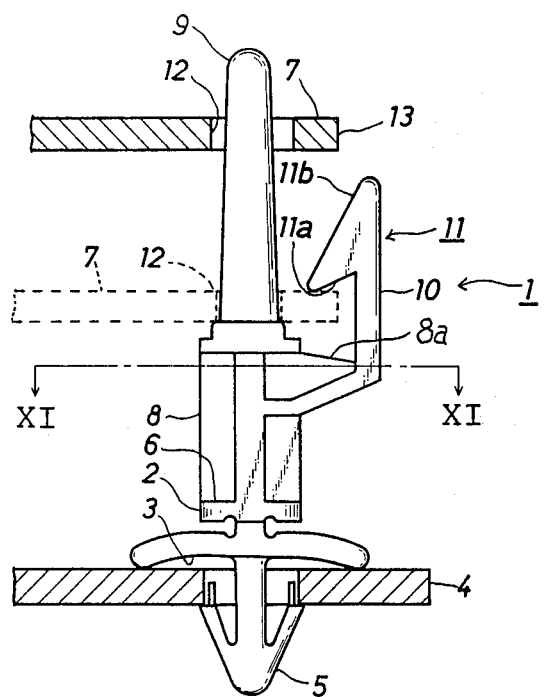
FIG. 10 is a side view of a board fastener of a prior art, a second board in section during mounting being shown and also shown in mounted position in dotted lines and a first board in section being shown in mounted position.
Figure 11:
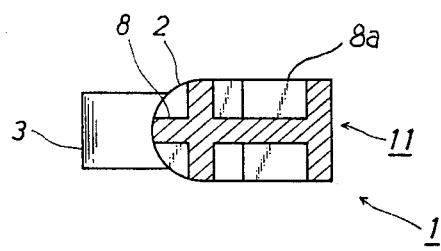
FIG. 11 is a sectional view of the board fastener of the prior art, taken on line XI—XI of FIG. 10.

FIG. 8 is a front view of a board fastener 60 of the second embodiment. FIG. 9 is a side view of the board fastener 60 taken at right angles to FIG. 8, a first board 61 and a second board 62 being shown in mounting position. In the second embodiment, a length of a post 63 is shorter than the post 30 of the first embodiment. Spring bars 65 directly extend from two corners of a base 64 since a resilient arm, extending upwardly from the corner of the base 64 as in the first embodiment, does not exist in the second embodiment. All other parts of the board fastener of the second embodiment are constructed the same as those of the first embodiment. Accordingly, the operations for mounting and removing the second board on and from the board fastener of the second embodiment are the same as those of the first embodiment. Namely, the second board 62 can be also easily mounted on and removed from the board fastener 60 of the second embodiment. Furthermore, the board fastener 60 can securely support the second board 62 to prevent the second board 62 from slipping out of the board fastener 60. The board fastener 60 of the second embodiment is especially effective when a shorter space between the first board 61 and the second board 62 is desired.

The foregoing description of two preferred embodiments for the purpose of illustrating the invention is not to be considered as limiting or restricting the invention, since many changes and modifications may be made by one skilled in the art without departing from the spirit or scope of the invention. For example, in the first and second embodiments described above, the first board securing member has two resilient branches. It may, however, have another shape of a branch, or the base may be attached to the first board directly with adhesives. Although the thrust-up member in the illustrated embodiments is I-shaped and is positioned in parallel with the second board to thrust the second board up, it may be formed in any shape (e.g., in L-shaped) so long as it can thrust the second board up when the handle is moved. Although two posts are used in the above embodiments for spacing two boards, only one post may be used instead for the same purpose.

What is claimed is:

1. A board fastener for holding a first board and a second board in position spaced apart from each other, at least the second board having at least two planar at least generally parallel surfaces, an aperture extending through the second board from one planar surface to the other planar surface, and an edge surface extending from one planar surface to the other planar surface adjacent the aperture, said board fastener comprising:
    (a) a base which, in use, is attached to the first board;
    (b) a post projecting in a first direction from said base, said post having an abutment surface which, in use, abuts against a first planar surface of the second board;
    (c) a projection projecting from said post in the first direction and extending beyond said abutment surface on said post, said projection being sized, shaped, and positioned so that, in use, it projects beyond said abutment surface on said post into an aperture in the second board; and
    (d) a handle comprising:
        (i) an arm projecting in the first direction from said base;
        (ii) a reverse detention member connected to said arm, said reverse detention member being sized, shaped, and positioned so that, in use, it abuts against a second surface of the second board opposite to the first surface of the second board, whereby the second board is gripped between said abutment surface on said post and said reverse detention member;
        (iii) a handling member sized, shaped, and positioned so that it can be manipulated from the second side of the second board, said handling member being connected to said arm and to said reverse detention member so that, when said handling member is moved away from said post, said reverse detention member is moved out of contact with the second side of the second board and beyond an edge surface of the second board; and
        (iv) a thrust-up member connected to said arm, to said handling member, and to said reverse detention member, said thrust-up member being sized, shaped, and positioned so that, in use, when said handling member is moved away from said post, said thrust-up member contacts the first side of the second board and pushes the second board away from said abutment surface on said post until an edge of said reverse detention members bears against the edge surface on the second board in a direction at least approximately perpendicular to the first direction, wherein:
    (e) said handle further comprises a spring bar having a first end and a second end, the first end of said spring bar projecting from said arm at least approximately perpendicularly thereto;
    (f) said thrust-up member has a first end and a second end, the first end of said thrust-up member being pivotally mounted on the second end of said spring bar; and (g) said reverse detention member and said handling member are mounted on the second end of said thrust-up member, whereby, when said handling member is moved away from said post in use, said thrust-up member pivots relative to said spring bar and said spring bar stores spring energy which biases the edge of said reverse detention member against the edge surface of the second board.

2. A board fastener as recited in claim 1 wherein:

(a) the first board has at least two planar at least generally parallel surfaces and an aperture extending through the first board from one planar surface to the other planar surface and (b) said base comprises:

(i) a first member which, in use, bears against a first surface of the first board;

(ii) a second member which, in use, bears against a second surface of the first board, opposite to the first surface of the first board; and (iii) a third member which connects said first member to said second member and, in use, passes through an aperture in the first board.

3. A board fastener as recited in claim 2 wherein at least one of said first and second members is sized, shaped, and positioned so that, in use, it bears resiliently against the first board.

4. A board fastener as recited in claim 1 wherein said handle has a sliding part sized, shaped, and positioned so that, when the second board is moved toward said post, said sliding part cams the second board in a direction so that said projection enters into the aperture in the second board.

* * * * *